(12) United States Patent
Mun et al.

(10) Patent No.: US 10,811,453 B1
(45) Date of Patent: Oct. 20, 2020

(54) PILLAR STRUCTURES FOR SUPPRESSING OPTICAL CROSS-TALK

(71) Applicant: OMNIVISION TECHNOLOGIES, INC., Santa Clara, CA (US)

(72) Inventors: Seong Yeol Mun, Santa Clara, CA (US); Bill Phan, San Jose, CA (US); Alireza Bonakdar, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/671,608

(22) Filed: Nov. 1, 2019

(51) Int. Cl.
*H01L 27/146* (2006.01)

(52) U.S. Cl.
CPC .... *H01L 27/14623* (2013.01); *H01L 27/1463* (2013.01); *H01L 27/1464* (2013.01); *H01L 27/14621* (2013.01); *H01L 27/14627* (2013.01); *H01L 27/14645* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 9,704,904 B2 | 7/2017 | Lai et al. | |
| 9,966,396 B2 | 5/2018 | Qian et al. | |
| 9,985,072 B1 * | 5/2018 | Wen | H01L 27/14609 |
| 2016/0372507 A1 * | 12/2016 | Yang | H04N 5/374 |
| 2018/0091723 A1 * | 3/2018 | Funaki | H04N 5/379 |
| 2019/0006399 A1 | 1/2019 | Otake et al. | |
| 2019/0131327 A1 * | 5/2019 | Chou | H01L 27/14629 |
| 2020/0137325 A1 * | 4/2020 | Mori | H04N 5/355 |

OTHER PUBLICATIONS

Deegan, B., "Root cause, impact and measurement for automotive imaging applications," Electronic Imaging, Autonomous Vehicles and Machines 2018: 146-1-146-6.

* cited by examiner

*Primary Examiner* — Thien F Tran
(74) *Attorney, Agent, or Firm* — Christensen O'Connor Johnson Kindness PLLC

(57) ABSTRACT

An image sensor includes a plurality of photodiodes arranged in rows and columns of a pixel array that is disposed in a semiconductor substrate. Individual photodiodes of the pixel array are configured to receive incoming light through a backside of the semiconductor substrate. A front side of the semiconductor substrate is opposite from the backside. A plurality of deep trench isolation (DTI) structures are formed laterally with respect to the photodiodes on the backside of the semiconductor substrate. The plurality of DTI structures are arranged between adjacent photodiodes. A plurality of pillar structures extend from a metal grid proximate to the backside and is formed proximate to the backside and aligned with the DTI structures.

18 Claims, 14 Drawing Sheets

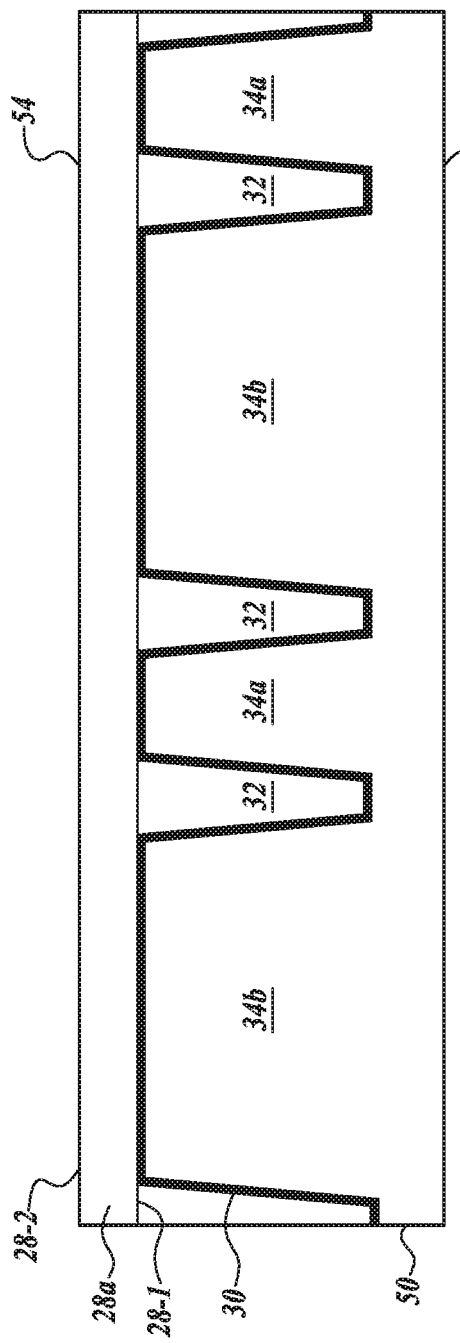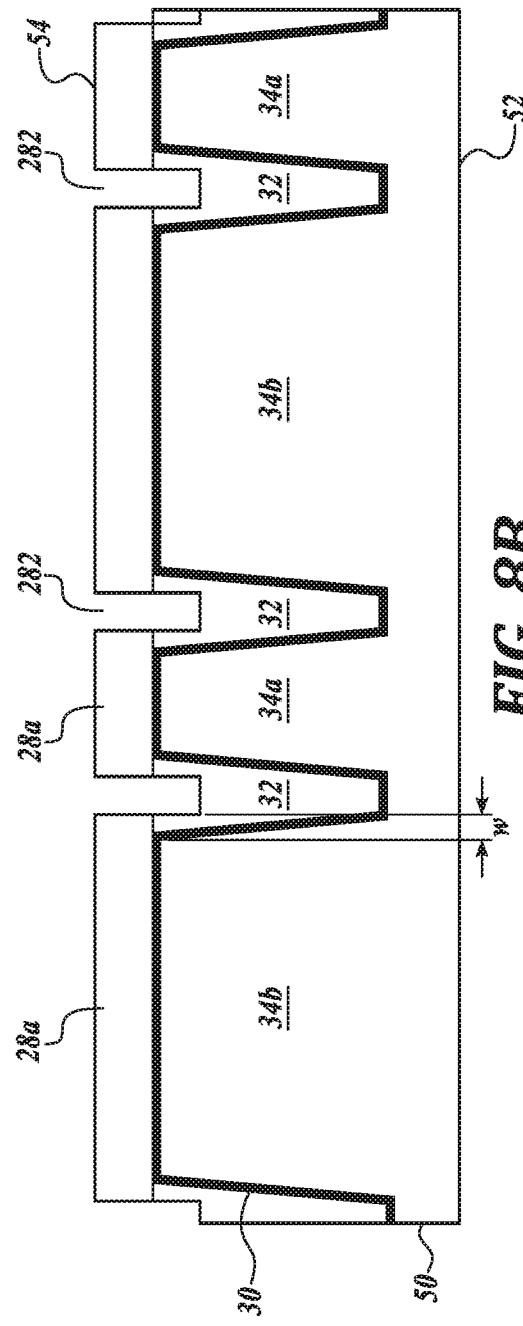

PILLAR STRUCTURES FOR SUPPRESSING OPTICAL CROSS-TALK

BACKGROUND INFORMATION

Field of the Disclosure

This disclosure relates generally to the design of counters of image sensors, and in particular, relates to suppressing cross-talk in image sensors.

Background

Image sensors have become ubiquitous. They are widely used in digital still cameras, cellular phones, security cameras, as well as medical, automobile, and other applications. The technology for manufacturing image sensors continues to advance at a great pace. For example, the demands for higher image sensor resolution and lower power consumption motivate further miniaturization and integration of image sensors into digital devices.

As the resolution of image sensors is increased, the spacing between the photodiodes is typically decreased, resulting in narrower and deeper photodiodes. These more closely packed photodiodes are more susceptible to optical noise caused by stray light. For example, after illuminating the target photodiode, the incoming light may be reflected toward neighboring photodiodes, therefore increasing the level of signal noise for those photodiodes. Stray light may also be generated by light reflections from the metallization layers.

In some applications, the photodiodes are illuminated from the backside of a semiconductor substrate of a semiconductor die. The noise generated by stray light may be even more significant for the backside illuminated photodiodes, because their semiconductor regions, being less shielded by the layers of electrical wiring at the front side of the image sensor, are more exposed to the stray light. As a result, the accuracy or the range of applicability of the image sensors may be limited.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 8A-8E are cross-sectional views of manufacturing steps of an image sensor in accordance with an embodiment of the present technology.

Figure 1:
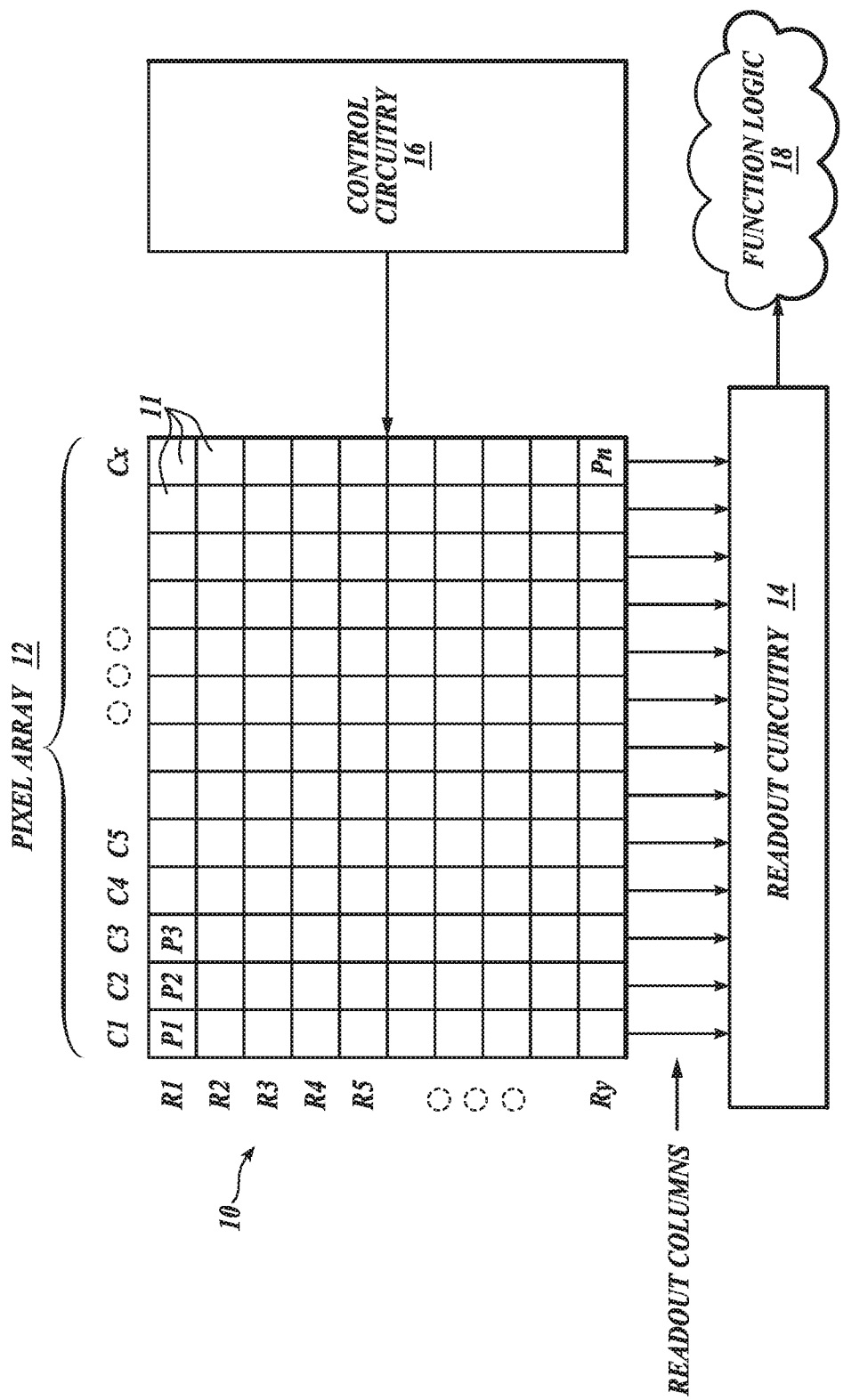
FIG. 1 is a diagram of an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, image sensors having reduced optical cross-talk are disclosed. In the following description specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90° or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, examples in accordance with the teachings of the present technology are directed to photodiodes (also referred to as channels or pixels) having improved immunity to optical cross-talk (also referred to as stray light, interchannel noise and/or inter-channel cross-talk). The backside illuminated photodiodes may be subjected to stray light that is reflected from the metallization or to stray light that arrives through the neighboring pixels, either as reflected or as transmitted light. When an image sensor includes both large and small photodiodes, the small photodiodes are generally more sensitive to optical cross-talk, because of their lower saturation levels.

In some embodiments, deep trench isolation (DTI) structures are formed in the semiconductor material of the photodiode to direct light toward the photodiodes, thus reducing electrical and optical crosstalk between photodiodes. In some embodiments, pillar structures (which may also be referred to as T-pillars or T-shape pillars) are formed and aligned with the DTI structures. These pillar structures can be obstacles in the path of stray light, thus limiting the intensity of stray light that illuminates the photodiodes. In some embodiments, the pillar structures may protrude into the DTI structures. In different embodiments, the pillar structures may have different alignments with respect to their corresponding DTI structure depending on the relative position of the photodiode within the image sensor (e.g., a photodiode in center of the pixel array, a photodiode that is horizontal left of the center, a photodiode that is vertical right of the center, etc.).

FIG. 1 is a diagram of an example image sensor 10 in accordance with an embodiment of the present technology. The image sensor 10 includes pixels 11 that are arranged in rows (R) and columns (C) of a pixel array 12. When the image sensor 10 is exposed to light, the individual pixels 11 acquire certain voltage values. After each pixel has acquired its voltage value, the image data is readout by a readout circuitry 14, and then transferred to a function logic 18.

Voltage values of the individual pixels ($P_1$-$P_n$) can be captured by the readout circuitry 14. For example, a control circuitry 16 may determine a specific row $R_i$ of the pixel array 12 for coupling with the readout circuitry 14. After the pixel values in row $R_i$ are captured, the control circuitry 16 may couple row $R_{i+1}$ with the readout circuitry 14, and the process repeats until voltage values of all the pixels 11 in the column are captured. In other embodiments, the readout circuitry 14 may readout the image data using a variety of other techniques (not illustrated in FIG. 1), such as a serial readout or a full parallel readout of all pixels 11 simultaneously. In different embodiments, the readout circuitry 14 may include amplification circuitry, analog-to-digital conversion ("ADC") circuitry, or other circuitry. In some embodiments, the pixel values are processed by a function logic 18. Such processing may, for example, include image processing, image filtering, image extraction and manipulation, determination of light intensity, etc.

Figure 2:
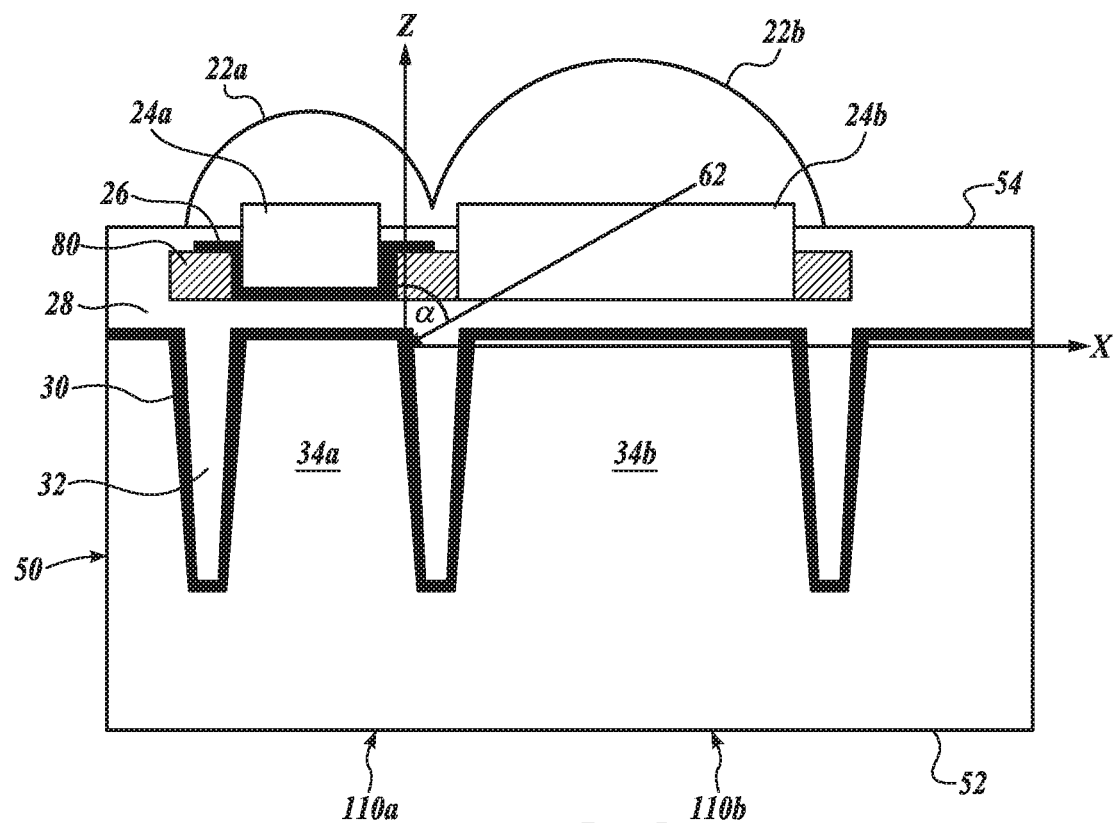
FIG. 2 is a cross-sectional view of example pixels in accordance with an embodiment of the present technology.

FIG. 2 is a cross-sectional view of example pixels of an example image sensor. For simplicity, two photodiodes 34a and 34b are illustrated, but in other embodiments the pixel array 12 may include a larger number of photodiodes 34a and 34b with photodiode 34a having a smaller full well capacity relative to the full well capacity of photodiode 34b. In other words, photodiode 34b may have larger capacity and store more photogenerated charges than photodiode 34a. In some examples, the large photodiode 34b has a larger light exposure area than the light exposure area of neighboring small photodiode 34a. In some embodiments, photodiodes 34a and 34b may be arranged in such manner that photodiodes 34a (referred to as small photodiodes) are disposed proximate to photodiodes 34b (referred to as large photodiodes). In some embodiments, one photodiode 34a (e.g., small photodiode) is arranged to be surrounded by two or more photodiodes 34b (e.g., large photodiodes). In some embodiments, the photodiodes 34a, 34b may be n-type photodiodes formed in the semiconductor material 50, where the semiconductor material 50 is a silicon substrate or a P-type silicon substrate. However, in other embodiments, the polarity may be reversed, for example, the photodiodes 34a, 34b may be p-type photodiodes formed in the n-type semiconductor material (substrate) 50.

In some embodiments, small photodiodes 34a are formed next to large photodiodes 34b. In the depicted example, the photodiodes 34a and photodiodes 34b are illuminated through a backside 54 of the image sensor through corresponding microlenses (MLs) 22a, 22b and corresponding color filters 24a, 24b. In operation, the microlenses 22a, 22b direct (refract) light toward their corresponding color filters 24a, 24b and further toward the respective photodiodes 34a, 34b. In other examples, it is appreciated that the photodiodes 34a and 34b may be illuminated through a front side 52 of the semiconductor substrate 50. The front side 52 of the semiconductor substrate 50 is opposite from the backside 54 of the semiconductor substrate 50. A plurality of deep trench isolation (DTI) structures 32 may be formed between adjacent photodiodes 34a, 34b to, for example, reduce the optical or electrical cross-talk between the neighboring photodiodes 34a, 34b. In some embodiment, the plurality of DTI structures 32 collectively forms a deep trench isolation grid on the backside 54 of semiconductor substrate 50, therefore optically and electrically isolating adjacent photodiodes 34a, 34b. The plurality of DTI structures 32 is formed on the backside 54 of the semiconductor substrate 50. Each of DTI structures 32 is configured to extend from the backside 54 into the semiconductor substrate 50 toward the front side 52. In one example, each of DTI structures 32 is arranged to extend from backside 54 of the semiconductor substrate 50 approximately 0.15-0.2 um deep into the semiconductor substrate 50. These DTI structures 32 may be formed with a lining 30 that limits diffusion of the DTI material into the semiconductor substrate 50. In some embodiments, the lining 30 may be deposited on a backside surface of the semiconductor substrate 50 and into the trench structure of each of the DTI structures 32. The lining 30 may include high-k material or dielectric material having a dielectric constant greater than 3.9. These DTI structures 32 may be back-filled with DTI material, e.g., silicon oxide to provide electric isolation between adjacent photodiodes 34a, 34b.

In some embodiments, color filters 24a, 24b are formed proximately to the backside 54 of the substrate 50. In some embodiments, a planarization layer is formed between the color filters 24a, 24b and the backside 54 of the semiconductor substrate 50. In some embodiments, a layer of buffer oxide may be formed between the color filters 24a, 24b and the backside 54 of the semiconductor substrate 50 to reduce surface stress of the semiconductor substrate 50.

In operation, color filters 24a, 24b selectively pass the light within a wavelength band (color) toward their corresponding photodiodes 34a, 34b, respectively. In some embodiments, the color filters 24a, 24b are at least partially surrounded by a metal grid 80. A light emitting diode (LED) flicker reduction (LFR) layer 26 (also referred to as a light attenuation layer) may be disposed between the color filter 24a over the small photodiode 34a and the metal grid 80. In operation, the LFR layer 26 may limit the intensity of light that illuminates the small photodiode 34a, thus reducing the possibility of photodiode saturation for small photodiode 34a during the integration period. The LFR layer 26 may be a thin metal film, for example, formed of titanium (Ti), titanium nitride (TiN), or a combination thereof. As such, the large photodiode 34b has higher sensitivity incident light and therefore may be utilized for lower light intensity sensing. Small photodiode 34a on the other hand has less light exposure area less sensitive to high intensity light compare to the large photodiode 34b, and is therefore utilized for higher light intensity sensing. By utilizing both a large photodiode 34b and small photodiode 34a in pixel array 12 HDR imaging sensing can be realized for image sensor 10.

Generally, the smaller photodiodes, i.e., photodiodes having small full well capacity (e.g., photodiode 34a) saturate faster than the larger photodiodes, i.e., faster than the photodiode having larger full well capacity (e.g., photodiode 34b). Therefore, in some embodiments, the color filter 24a includes a light attenuation layer 26 for attenuating the incoming light. However, the undesired optical cross-talk caused by, for example, stray light 62 may become relatively more significant even when the color filter 24a of the small photodiode 34a includes the LFR layer 26 that limits the incoming light to the small photodiode 34a.

In operation, the photodiodes 34a, 34b photogenerate electrical charge in response to incident incoming light. In some embodiments, the incident incoming light may be directed through a vertical stack that includes a micro-lenses (ML) 22a or 22b, a color filter 24a or 24b surrounded by metal grid 80, and a layer of buffer oxide 28 before reaching the corresponding photodiodes 34a or 34b. The color filters 24a, 24b may pass light in different wavelength bands (colors), such as red, blue, green, visible, etc. The illustrated vertical stack operates to filter the incoming light and to direct the light toward the respective photodiodes 34a, 34b. As the filtered light reaches the photodiodes 34a, 34b, a corresponding electrical charge is photogenerated at appropriate intervals, which is then read out from the pixel array 12 by the readout circuitry (e.g., the readout circuitry 14 of FIG. 1). DTI structures 32 limit the optical cross-talk between photodiodes 34a, 34b. However, undesired optical cross-talk (e.g., light ray 62) coming from the color filter 24b of the neighboring large photodiode 34b through the buffer oxide 28 between the metal grid 80 and the semiconductor substrate 50 (at angle α) may still saturate the small photodiode 34a. The sensitivity of the small photodiode to optical cross-talk is described in further below with reference to FIGS. 3A and 3B.

Figure 3A:
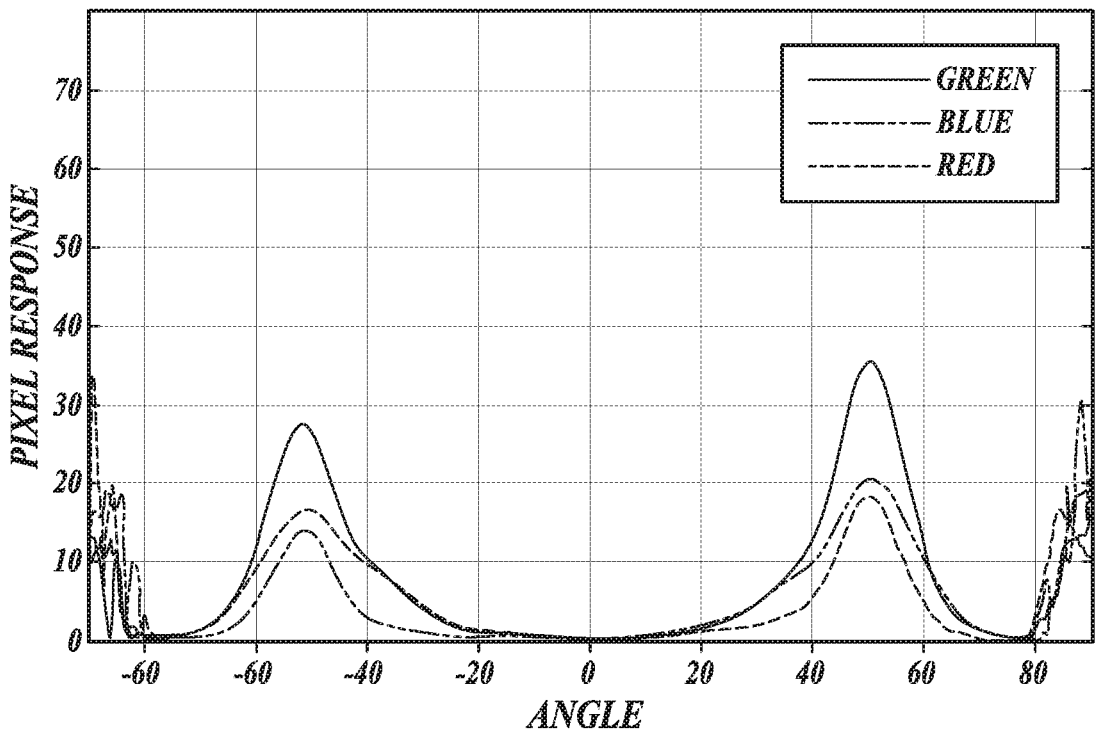
FIG. 3A is an example graph of pixel response for the image sensor shown in FIG. 2.

FIG. 3A is an example graph of pixel response from the image sensor shown in FIG. 2. The horizontal axis shows the angle of the light entering small photodiodes 34a (e.g., green, blue, and red). The vertical axis shows the pixel response in percentage. Incoming light directed by microlens and filtered by color filter toward the respective large photodiodes may illuminate the neighboring small photodiodes because of a relatively large incident angle α. As a result, the small photodiodes 34a may be saturated by optical cross-talk from the light nominally directed to the neighboring large photodiodes 34b. Even relatively small amounts of cross-talk from the neighboring large photodiode 34b can affect significantly the response of the small photodiode 34a. For example, at an incoming angle α of +/−50°, the response of a small pixel to stray light (i.e., the cross-talk) becomes comparable to the response of the same pixel to incident light having an incoming angle of 0° (i.e., the light coming directly vertically into the small pixel). Stated differently, the magnitude of the cross-talk may become comparable to the designed-for response of the same pixel. In many embodiments, such magnitude of the cross-talk is undesirable.

Figure 3B:
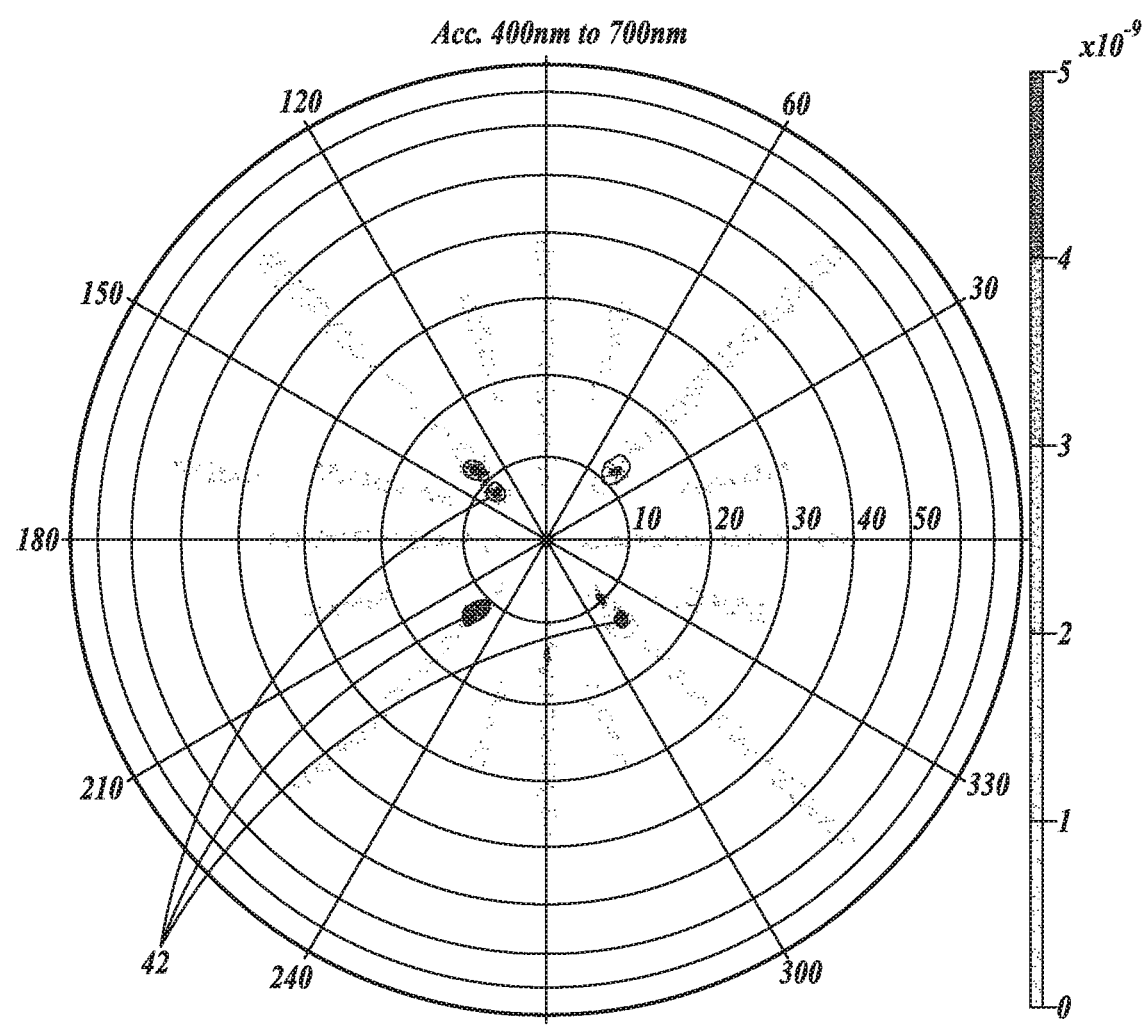
FIG. 3B is an example graph of optical noise for the image sensor shown in FIG. 2.

FIG. 3B is an example graph of optical noise for the image sensor shown in FIG. 2. The numbers around the illustrated circular graph designate the azimuthal angle of the incident incoming light (e.g., angle α), while the vertical bar on the right indicates the intensity of optical noise. In the illustrated embodiment, the incoming light is in the visible light spectrum (from about 400 nm to about 700 nm). Circled zones 42 illustrate the higher light intensity optical noise that corresponds to petal flare. In many embodiments, depending on the intensity of the zones 42, the petal flare may be interpreted as the small photodiodes 34a becoming saturated by the optical cross-talk from the microlenses and/or color filters of the neighboring large photodiodes 34b.

Figure 4:
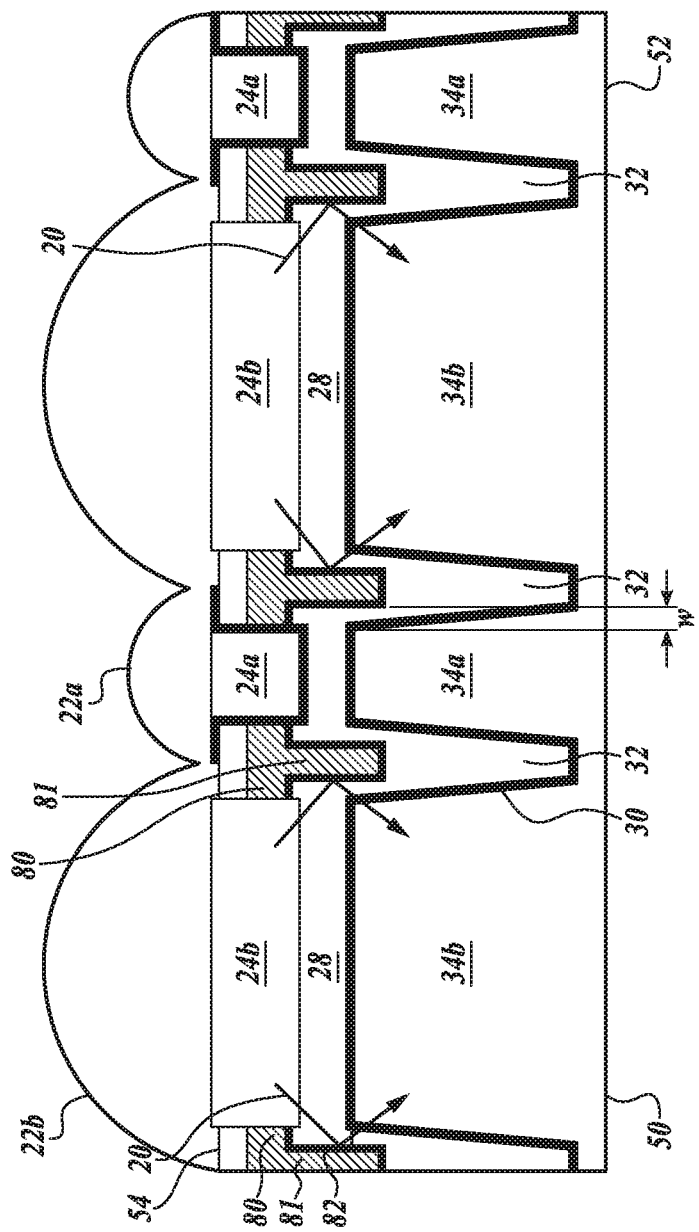
FIG. 4 shows cross-sectional view of example pillar structures in accordance with embodiments of the present technology.

FIG. 4 shows cross sectional view of example pillar structures 81 in accordance with the embodiments of the present technology. Each of the illustrated pillar structures 81 may extend from the corresponding metal grid 80 through buffer oxide 28 and towards the DTI structures 32. In some embodiments, each of the illustrated pillar structures 81 may extend from the respective metal grid 80 through buffer oxide 28 and a first depth into the DTI structures 32. As shown, the pillar structures 81 are formed proximate to a backside 54 of the image sensor and include a lining 82 (also referred to as a diffusion barrier), which prevents or reduces diffusion of the material of the pillar structures 81 (e.g., a metal) into the buffer oxide 28, and into semiconductor material 50. In one example, each of the metal grid 80 combined with respective pillar structure 81 forms a T-shape, with the narrower pillar structure 81 portion extending towards (or extending to a first depth) into the DTI structure 32 as shown. In other words, a lateral dimension of the pillar structure 81 is narrower than a lateral dimension of the corresponding metal grid 80 as shown. In another example, it is noted that if the metal grid 80 and pillar structure 81 have the same lateral dimensions and therefore form an I-shape, there is an increased risk that the metal material inside the pillar structure 81 may be etched away if the metal grid 80 is misaligned by natural inline process variations, which may create defects or damage to the pillar structure 81. In some embodiments, the first depth is configured to be less than or equal to 50 nm or 0.05 um. The extended first depth of each pillar structure 81 is configured such that when metal grids 80 shift during process, for example to compensate for chief-ray angle, the corresponding pillar structures 81 do not cause damage (e.g., metal contamination) to the layer of lining 30 and nearby silicon regions in the semiconductor material (e.g., photodiode regions).

In operation, the photodiodes 34a, 34b are illuminated through the backside 54, and through the MLs 22a, 22b. Light 20 that passes through the color filter 24b impinges onto the pillar structure 81 (which may also be referred to as the T-pillar as illustrated in FIG. 4), and reflects back towards the large photodiode 34b. Therefore, in operation the pillar structures 81 confine light 20 into the intended large photodiode 34b, thus preventing or at least reducing cross-talk contamination of the small photodiode 34a. The opposite is generally also true—the pillar structure 81 also limits cross-talk contamination of the large photodiode 34b from the light intended for small photodiode 34a passing through the color filter 24a. However, in many practical scenarios it is appreciated that the cross-talk contamination of the small photodiode 34a is a more significant issue than the cross-talk contamination of the large photodiode 34b.

In some embodiments, the pillar structure 81 includes, for example, a metallic material such as tungsten (W), aluminum (Al), copper (Cu), etc., or such material as polysilicon. In some embodiments, the pillar structure 81 has a lining 82 of titanium (Ti), or titanium nitride (TiN). In general, the thickness and material of the pillar structure 81 is selected to minimize transmission of the incoming light by reflecting or absorbing the incoming light. In one embodiment, the pillar structure 81 has a width of 0.09 um, and extends 0.015 um into the DTI structure 32. In some embodiments, the pillar structures 81 are spaced apart from the lining of corresponding DTI structures 32. In the example shown in FIG. 4, there is a lateral distance w between the pillar structure 81 and the DTI structure 32 (e.g., 0.015 um on each side). The DTI structure may be 0.12 um deep. In other embodiments, the lining 82 of the pillar structures 81 is spaced apart from the lining 30 of the corresponding DTI structures 32. In still other embodiments, a lining 82 of the pillar structure 81 may come into contact with a lining 30 of the DTI structure 32.

In the example depicted in FIG. 4, it is noted that the illustrated pillar structures 81 are centered with respect to their corresponding DTI structures 32. In other embodiments, the pillar structures 81 may have different alignments with respect to their corresponding DTI structure 32 depending on the relative position on the photodiodes 34a, 34b within the image sensor, as explained with respect to FIGS. 5-9 below.

Figure 5:
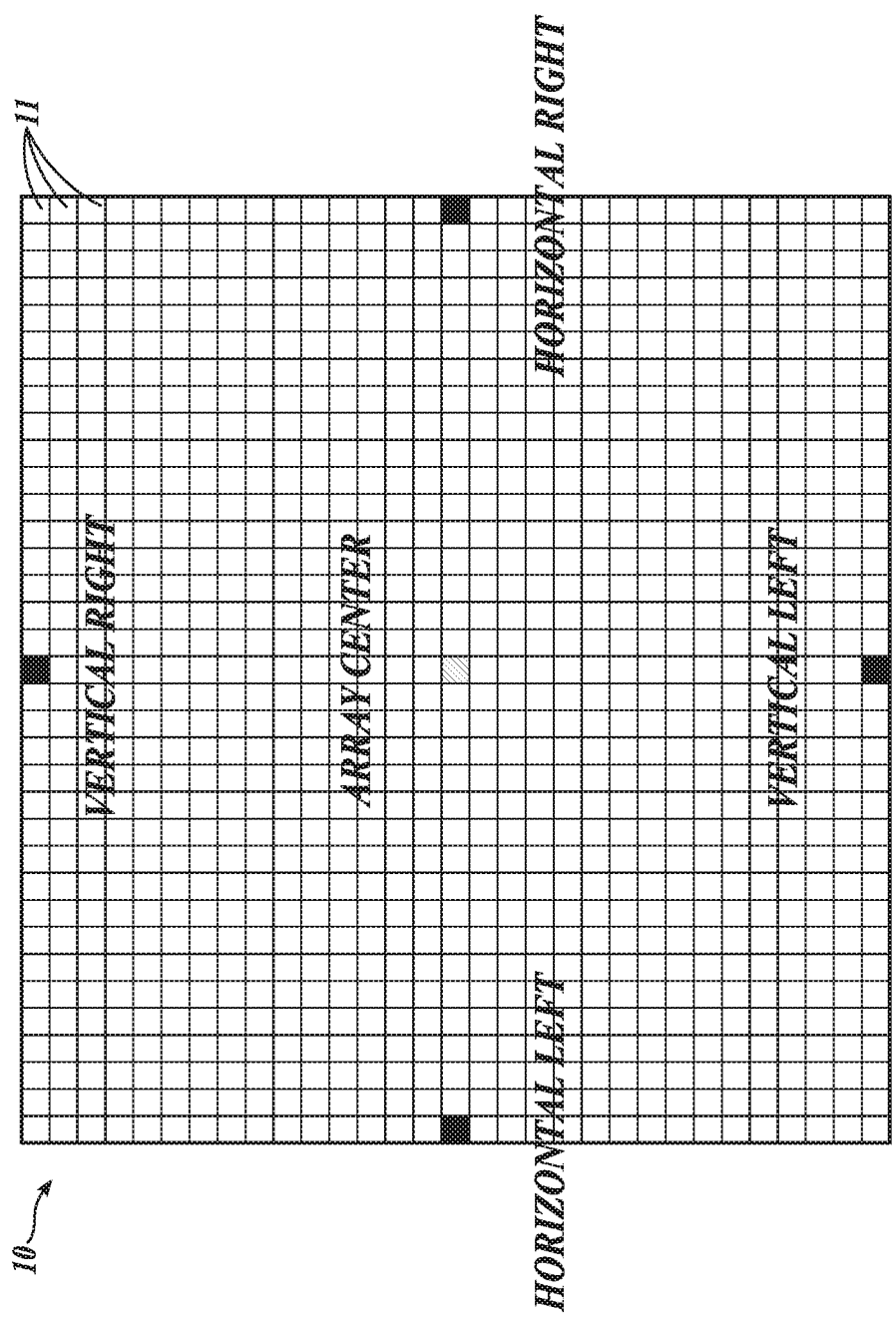
FIG. 5 shows top plan view of an example image sensor in accordance with an embodiment of the present technology.
Figure 6:
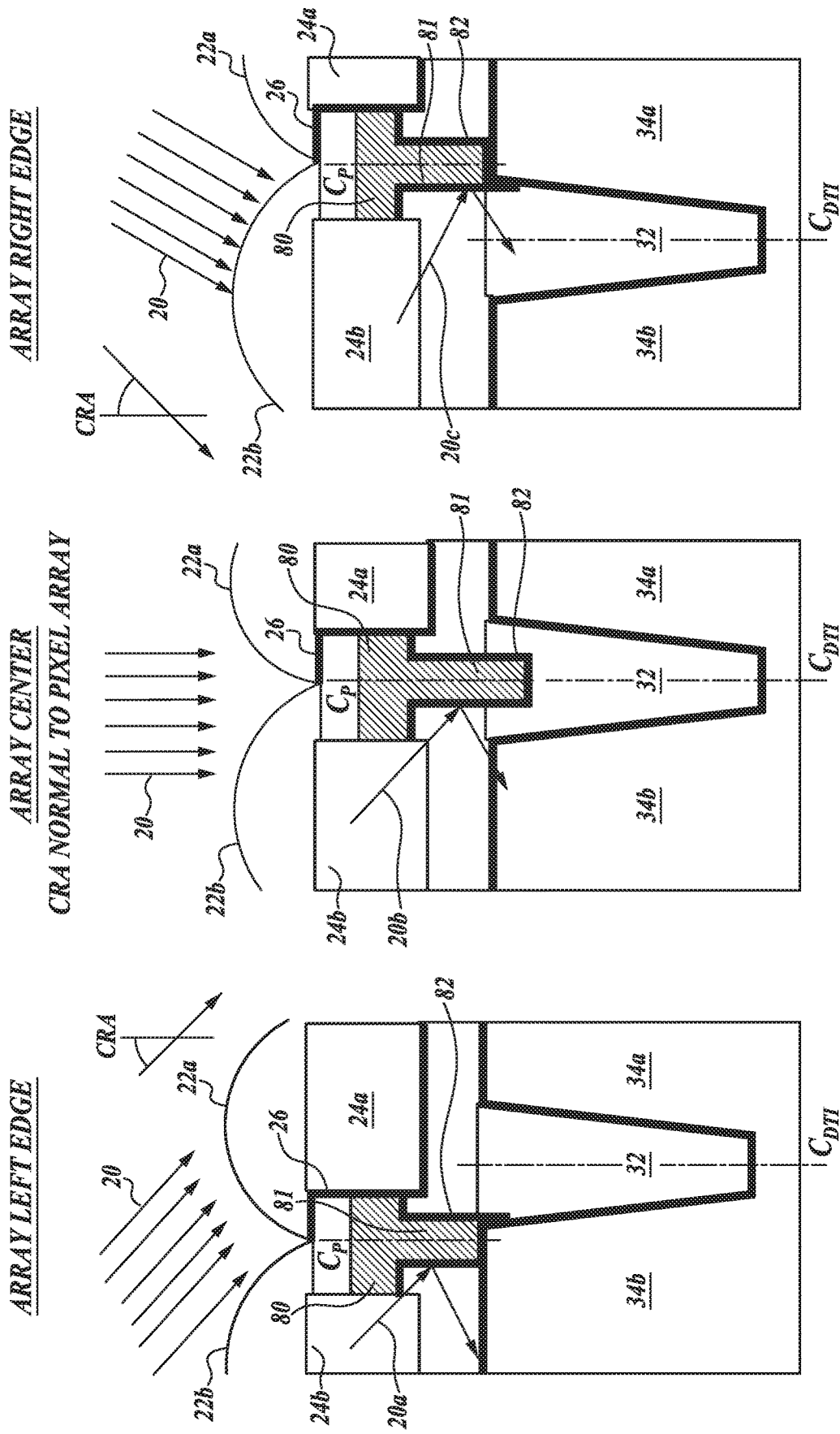
FIGS. 6A-6C are example cross-sections of photodiodes at different locations on an image sensor in accordance with an embodiment of the present technology.

To illustrate, FIG. 5 shows a top plan view of an example image sensor 10 in accordance with the embodiments of the present technology. The image sensor 10 includes pixels 11 arranged in rows and columns that form a pixel array, for example pixel array 12 of FIG. 1. Several example locations of a photodiode within the pixel array of image sensor 10 are designated in FIG. 5 as "array center," "vertical right," "vertical left," "horizontal right," and "horizontal left." In general, a source of light having a finite distance from the image sensor 10 illuminates differently located pixels 11 at different angles. Therefore, in some embodiments, the pillar structures 81 may have different alignments with respect to their corresponding DTI structures across the pixel array 12 in accordance with the teachings of the present technology.

FIGS. 6A-6C are example cross-sections of the photodiodes at different locations in a pixel array 12 of an image sensor in accordance with an embodiment of the present technology. In some embodiments, the relative locations of the ML and the DTI structures may shift based on the CRA and the location of the photodiodes 34a, 34b within the pixel array 12. Starting from FIG. 6C, a pillar structure 81 extends from metal grid 80. The pillar structure 81 corresponds to the pixel that is located proximate to the right edge at a periphery of the pixel array 12, i.e., FIG. 6C may correspond to the pixel that is located in the right most region with respect to the array center shown in FIG. 5. To improve the capture of the incoming light 20 of the small photodiode 34a, while simultaneously reducing the amount of the optical cross-talk from the large pixel 110b into the small photodiode 34a, the pillar structure 81 may be laterally offset as illustrated to the right side of the DTI structure 32 (i.e., toward the neighboring small photodiode 34a). In one example, an incident incoming light 20c is reflected back by the pillar structure 81 to the large photodiode 34a. In one example, a portion of incoming light 20 may be absorbed or reflected by metal grid 80 formed between color filters 24a, 24b. Therefore, a centerline $C_P$ of the illustrated pillar structure 81 may be moved to the right of a centerline $C_{DTI}$ of the DTI structure 32. As a result, a lining 82 of the pillar structure 81 contacts a lining 30 of the DTI structure 32, and a smaller proportion of the light 20 that passes through the color filter 24a that would otherwise impinge onto the small photodiode 34a is reflected by the pillar structure 81 back toward the large photodiode 34b. In some embodiments, the pillar structure 81 is formed with a liner 82, which limits diffusion of the material of the pillar structure 81 into the semiconductor substrate 50 preventing metal contamination. Liner 82 may also refer to as a diffusion barrier layer, and in one example, liner 82 may be formed from titanium, titanium nitride, tungsten nitride, tantalum nitride or a combination thereof.

In FIG. 6B, the center of the pillar structure 81 (e.g., centerline $C_P$) is aligned with the center of the DTI structure 32 (e.g., centerline $C_{DTI}$). The chief ray angle (CRA) for is now smaller or close to zero (normal to the pixel array) for the more-centrally located small photodiode 34a and large photodiode 34b in the pixel array. In one example, photodiodes 34a, 34b illustrated in FIG. 6B represent pixel cells that are located at or proximate to the array center of pixel array illustrated in FIG. 5. To improve the capture of the incoming light by the small photodiode 34a, while simultaneously reducing the amount of optical cross-talk coming from the large pixel 110b into the small photodiode 34a, the pillar structure 81 may be aligned to the centerline $C_{DTI}$ of the DTI structure 32. In one example, an incident incoming light 20b is reflected back by the pillar structure 81 to the large photodiode 34a in FIG. 6B. In one example, a portion of incoming light 20 may be absorbed or reflected by metal grid 80 formed between color filters 24a, 24b. Since the chief ray angle (CRA) is effectively smaller for the more centrally located small photodiode 34a than for the pixel at the left edge proximate to a periphery of the pixel array 12, more incoming light 20 impinges on this small photodiode 34a, and the relative effect of the optical cross-talk becomes smaller. Therefore, the centerline $C_P$ of the pillar structure 81 may be closer-to or aligned-with the centerline $C_{DTI}$ of the DTI structure 32.

FIG. 6A shows a pillar structure 81 that is located proximate to the left edge at a periphery of the pixel array 12, i.e., FIG. 6A may correspond to the pixel that is located in the left most region with respect to the array center shown in FIG. 5. To improve the capture of the incoming light 20 by the small photodiode 34a, while simultaneously reducing the amount of the optical cross-talk from the large pixel 110b into the small photodiode 34a, the pillar structure 81 may be offset as illustrated to the left side of the DTI structure 32 (i.e., toward the neighboring large photodiode 34b). In one example, an incident incoming light 20a is reflected back by the pillar structure 81 to the large photodiode 34b in FIG. 6C. In one example, a portion of incoming light 20 may be absorbed or reflected by the metal grid 80 formed between color filters 24a, 24b. Therefore, a centerline $C_P$ of the illustrated pillar structure 81 may be moved or shifted to the left of a centerline $C_{DTI}$ of the DTI structure 32. As a result, a lining 82 of the pillar structure 81 contacts a lining 30 of the DTI structure 32, and a larger proportion of the light 20 that passes through the color filter 24b that would otherwise impinge onto the small photodiode 34a is reflected by the pillar structure 81 back toward the large photodiode 34b. The illustrated small photodiode 34a is therefore better shielded from stray light and is therefore less likely to become saturated by the stray light, because this pixel, due to its smaller CRA, receives relatively more light from the source of illumination.

In some embodiments, the centerline $C_P$ of the pillar structure 81 is more aligned with the centerline $C_{DTI}$ of the DTI structure 32 when located closer to the array center (or the optical center of the pixel array 12) as illustrated in FIG. 6B, and the centerline $C_P$ of the pillar structure 81 is laterally shifted or offset left or right from the centerline $C_{DTI}$ of the DTI structure 32 when moved away from the array center as shown in FIG. 6A or FIG. 6C depending on the relative location with respect to the array center to accommodate the chief ray angle of incoming light for better optical crosstalk performance. The lateral offset or shift between the centerline $C_P$ of the pillar structure 81 and the centerline $C_{DTI}$ of the DTI structure 32 increases as function of distance, i.e., the lateral offset or shift between the centerline $C_P$ of the pillar structure 81 and the centerline $C_{DTI}$ of the DTI structure 32 increases as the distance from the array center increases in horizontal or vertical direction across the pixel array.

In some embodiments, the distance between the pillar structure 81 and the liner 30 is the same at the left and right edges of the pixel array, but in the opposite direction. In some embodiments, the liner 30 includes $Ta_3O_5$ with a thickness of 520 Å. A high-k film including $HfO_2$ may be formed between the $Ta_3O_5$ and the silicon substrate. The pillar structure 81 may be shifted to follow the shifting of the micro-lenses and/or the DTI structure 32. The shape and extended depth of the pillar structure 81 allows the pillar structure 81 to move within the DTI structure 32 without damaging the high-k film lining the DTI structure and the Si substrate. In some embodiments, the $Ta_3O_5$ liner further provides an etching stop, which may prevent the metal of pillar structure 81 from penetrating the Si substrate.

Figure 7:
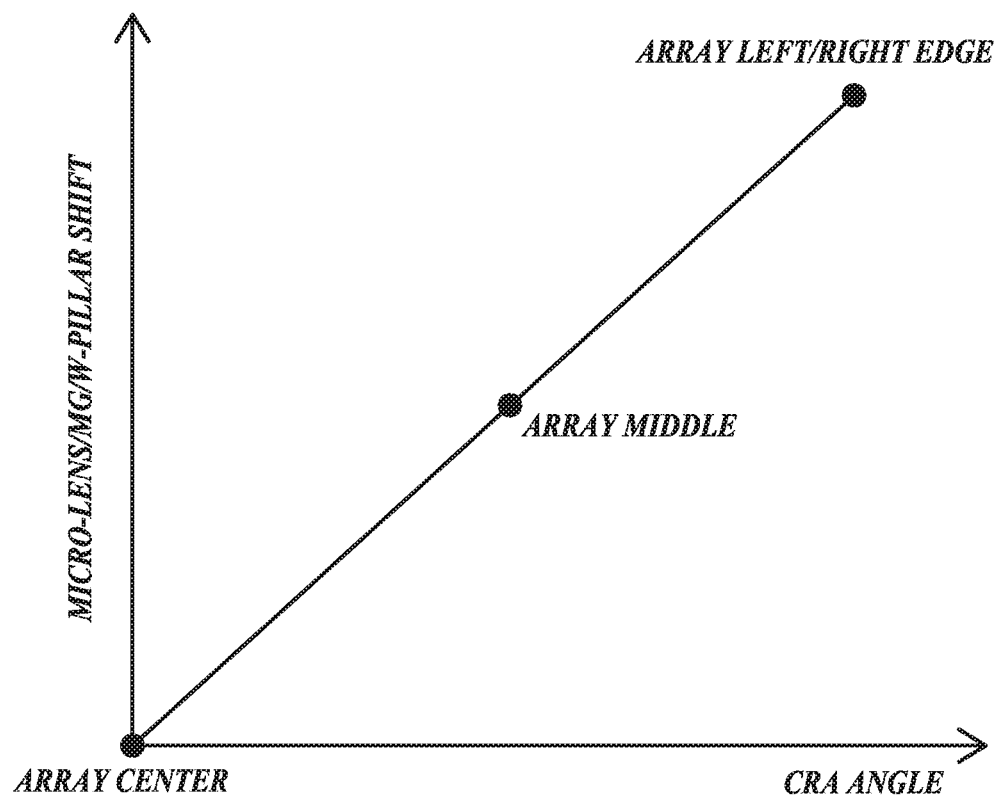
FIG. 7 is an example graph of pillar locations on an image sensor in accordance with an embodiment of the present technology.

FIG. 7 is an example graph of pillar locations on an image sensor in accordance with an embodiment of the present technology. The horizontal axis corresponds to the CRA angle. The vertical axis corresponds to the shift of the micro-lens (ML), metal grid (MG), and/or pillar structures. The graph shows that the pillar structures may have different alignments with respect to their corresponding DTI structure depending on the relative position of the photodiode within the pixel array 12 of the image sensor. Example locations on the pixel array 12 are designated "Array Center," "Array Middle," and "Array Left/Right Edge." As shown in FIG. 7, as the CRA increases, the shift of the ML, metal grid, and pillar structure increases, as also illustrated in the examples depicted FIGS. 8A-8C.

Figure 8C:
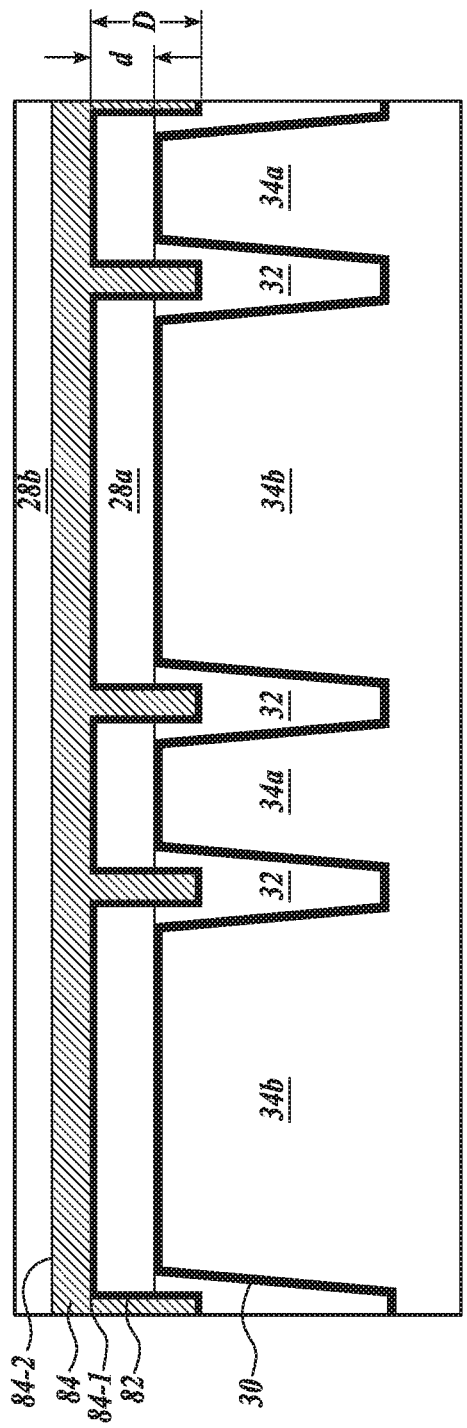

FIGS. 8A-8E are cross-sectional views of manufacturing steps of an image sensor in accordance with an embodiment of the present technology. FIG. 8A shows a semiconductor substrate 50 with a front side 52 opposite a backside 54. As one example, the material of the semiconductor substrate is silicon. However, one skilled in the art will appreciate that any group III elements (B, Al, Ga, In, Tl), group IV elements (C, Si, Ge, Sn, Pb), group V elements (N, P, As, Sb, Bi), and suitable combinations of these elements, may be used to form the semiconductor substrate.

Photodiodes 34a, 34b may be formed in the semiconductor substrate 50 by, for example, by ion implantation. The photodiodes 34a, 34b may be formed by implanting the semiconductor substrate 50 with suitable N-type dopants, e.g., arsenic (As) or phosphorus (P) having suitable implant energy or suitable P-type dopants, e.g., boron (B) having suitable implant energy. DTI structures 32 may be formed laterally with respect to the photodiodes 34a, 34b, and proximate to the backside 54 of the semiconductor substrate 50 by photolithography and etching process. For example, a photoresist mask patterned with openings corresponding to DTI structures 32, followed by a dry etching, a wet etching or a combination of dry and wet etching process to form the plurality of DTI structures 32. In some embodiments, the DTI structures 32 include a liner 30. A layer of buffer oxide 28a may be formed on the backside 54 and above the DTI structures 32 by, for example, material deposition such as chemical vapor deposition or thermal oxidation. In some embodiments, the layer of buffer oxide 28a has a thickness of 1,200 Å-1,300 Å. The illustrated layer of buffer oxide 28a has a first side 28-1 that faces the DTI structure 32, and a second side 28-2 that faces away from the first side 28-1. In one embodiment, a DTI structure 32 is formed to have depth of at least 0.15 um and is filled with an oxide material. A high-k film (not shown in FIG. 8A) that includes for example hafnium oxide $HfO_2$ may be formed between the silicon substrate 50 and the layer of buffer oxide 28a. In some embodiments, this high-k film includes tantalum oxide $Ta_3O_5$ having a thickness of 520 Å.

FIG. 8B shows an etched layer of buffer oxide 28a that includes a plurality of openings 282. These openings 282 extend through the buffer oxide 28a and into the DTI structures 32 as shown are at least partially aligned with the DTI structures 32. The openings 282 may be formed by patterning and etching the layer of buffer oxide 28a using dry etch process. As will be shown, the openings 282 may be later filled with a metal material to form pillar structures in accordance with the teachings of the present disclosure. In some embodiments, the openings 282 are separated from the DTI liner 30 by a width w (e.g., 0.015 um on each side). The liner 30 may be used as an etch stop layer.

FIG. 8C illustrates the metal layer 84 that is formed by, for example material deposition, such as chemical vapor deposition (CVD) or atomic level deposition (ALD) into openings 282 and on the buffer oxide 28a. The metal layer 84 may include, for example, a metallic material such as tungsten (W), aluminum (Al), copper (Cu), etc., or such material as polysilicon. Illustrated metal layer 84 has a first surface 84-1 facing the second side of the layer of buffer oxide 28a, and a second surface 84-2 facing away from the first surface 84-1. In some embodiments, the metal layer 84 includes a liner 82. In one example, the liner 82 may be deposited into the openings 282 prior to the deposition of metal layer 84. The material for liner 82 may include titanium, titanium nitride, tungsten nitride, tantalum nitride or a combination thereof. A depth D of the pillars 81 may be greater than or equal to the thickness d of the buffer oxide 28a. In some embodiments, tungsten (W) is deposited to fill the etchings and form the metal layer 84. The surface of the metal layer 84 may be chemically polished to flatten or planarize the metal layer 84, for example by a chemical polishing process, followed by depositing another layer of the buffer oxide 28b.

Figure 8D:
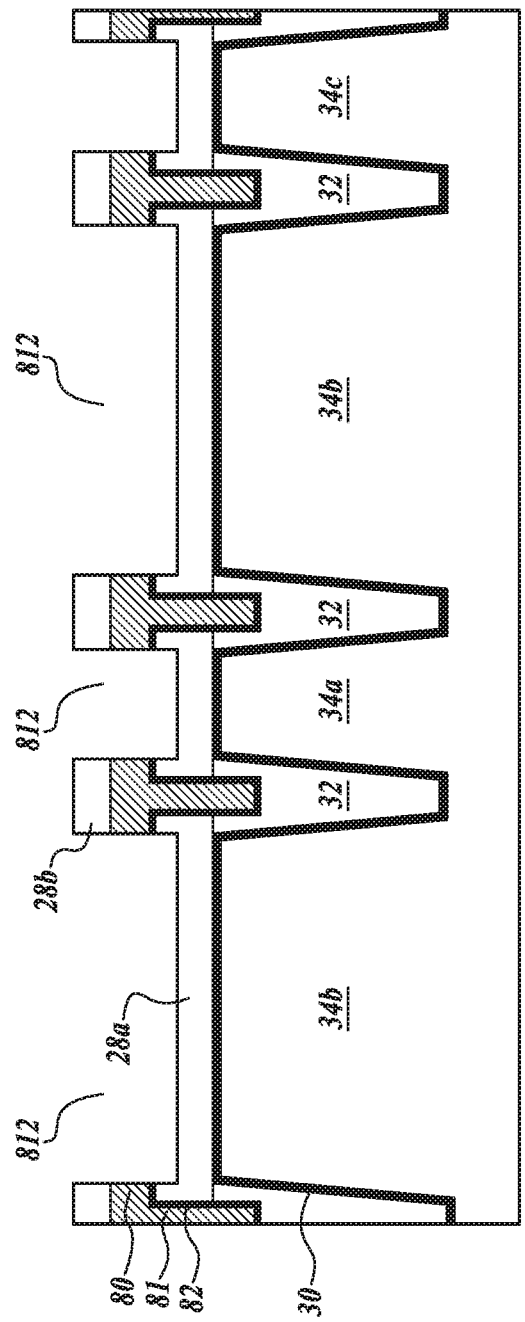

FIG. 8D shows the metal layer 84 after etching, which creates openings 812 and metal grid 80 from which the pillar structures 81 extend. In some embodiments, etching the metal layer 84 and creating openings 812 provides a mask, which may be utilized for the subsequent color filter array fill.

Figure 8E:
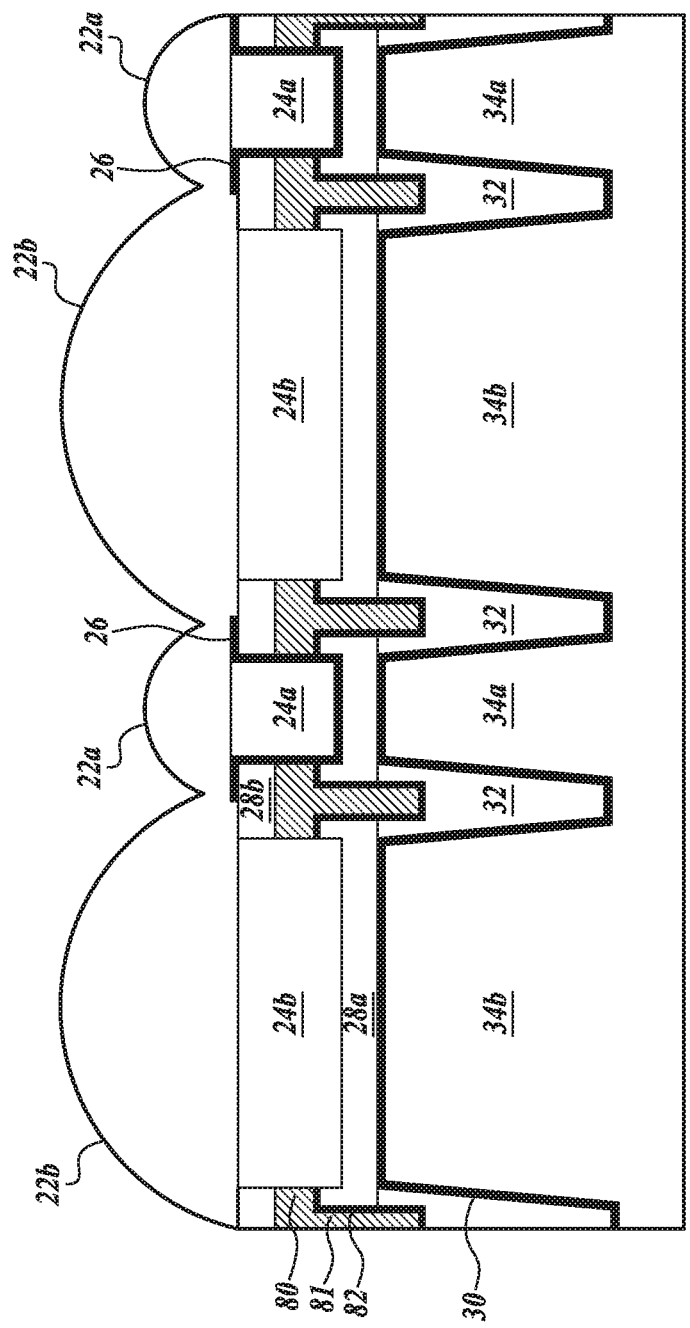

FIG. 8E shows color filters 24a, 24b that are at least partially embedded into the openings 812 and are thus laterally adjacent to the pillar structures 81 as shown. A plurality of microlenses (MLs) 22a, 22b may be formed (or deposited) above the color filters 24a, 24b. In some embodiments, LFR layer 26 (e.g., Ti/TiN) may be formed as a light attenuation layer over the opening corresponding the light exposure area of small photodiodes 34a prior to forming color filter 24a. In some embodiments, a first height of micro-lens 22a, i.e., a distance between the top of micro-lens 22a and the respective color filter 24a may be different from a second height of micro-lens 22b, i.e., the distance between the top of micro-lens 22b and the respective color filter 24b. For example, the second height of micro-lens 22b may be greater than the first height of micro-lens 22a, i.e., micro-lens 22b is taller than the micro-lens 22a, to compensate curvature differences between micro-lens 22a and micro-lens 22b such that micro-lens 22a and micro-lens 22b have substantially the same focal length for the respective photodiodes 34a, 34b.

Figure 9:
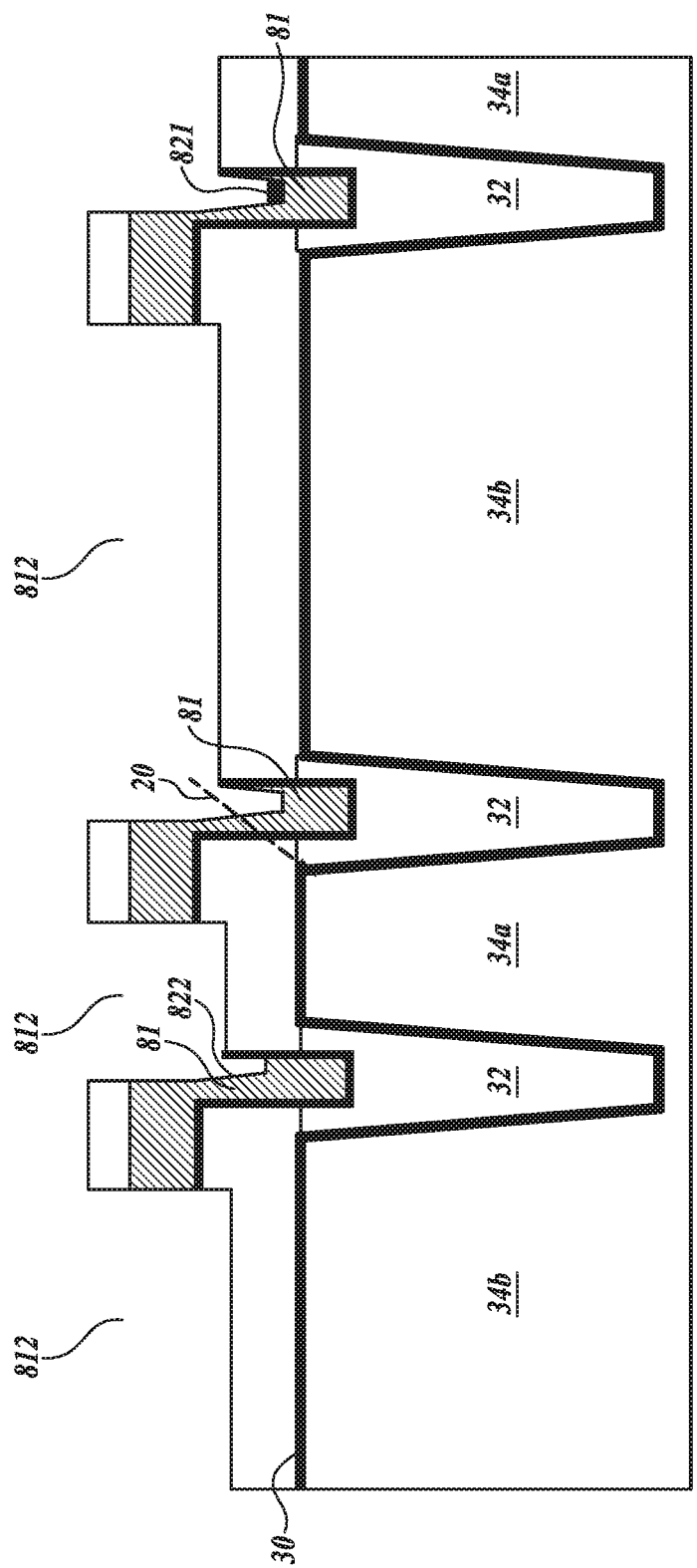
FIG. 9 is a cross-sectional view of yet another example image sensor in accordance with an embodiment of the present technology.

FIG. 9 is a cross-sectional view of yet another example image sensor in accordance with the present technology. For the illustrated image sensor, the pillar structures 81 extend into DTI structures 32. During the etching process, the top of the pillar structure 81 may be susceptible to faster etching rates that create defects 822 by partially etching away metal of the pillar structure 81. Furthermore, cleaning solvent 821 that is used after the etching process may become trapped inside the defects 822 in the pillar structure 81. Post-etch residue, for example cleaning chemicals, solvents, or color filter array litho-developer may remain in the deep void where chemical drying may be difficult. As a result, defects 822 may be formed, damaging the pillar structure. Nevertheless, in at least some embodiments, even a weakened pillar structure 81 that includes defects 822 still prevents light 20 from penetrating through.

Figure 10:
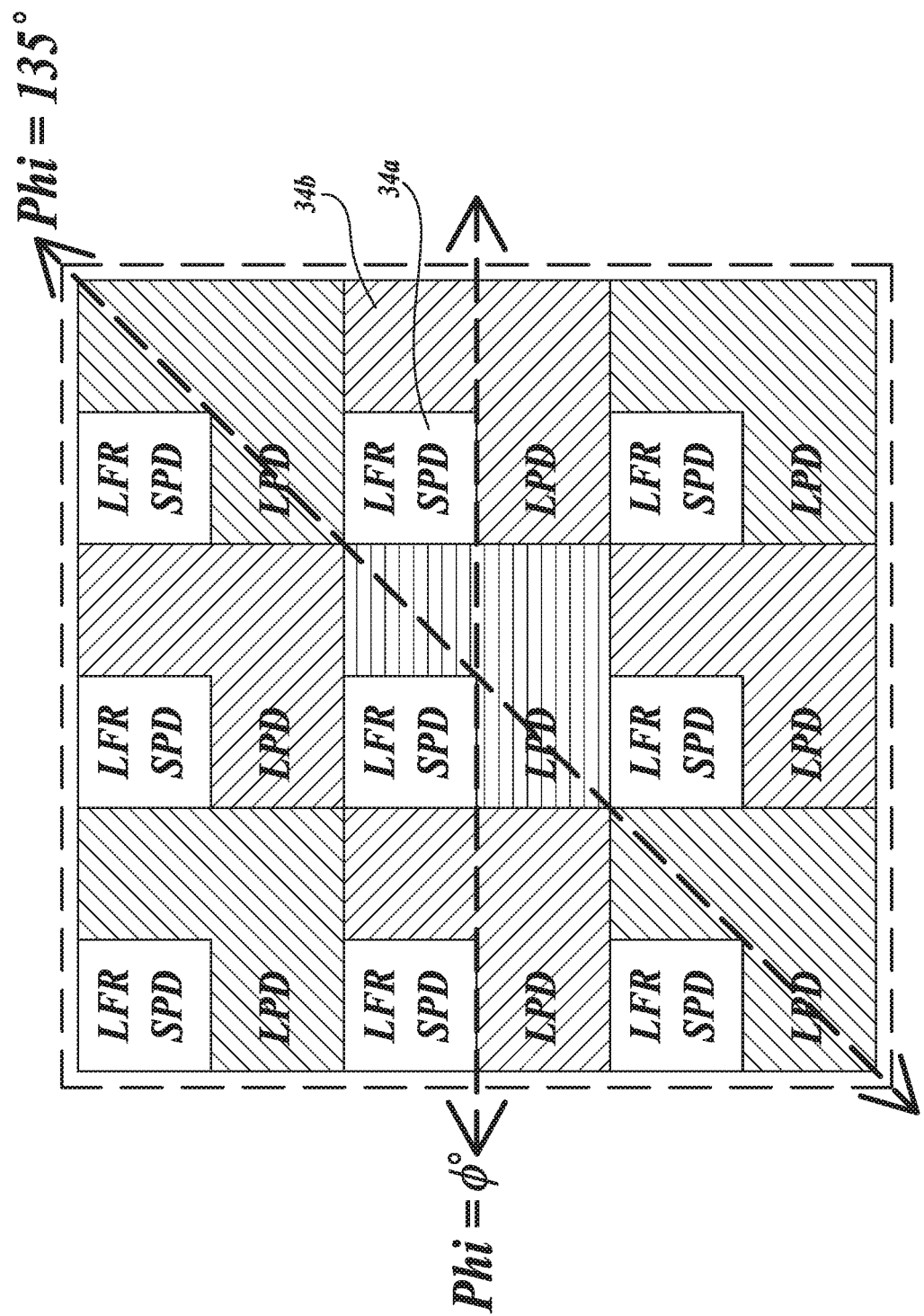
FIG. 10 shows top plane view of example image sensor in accordance with an embodiment of the present technology.

FIG. 10 shows a top plane view of an example image sensor in accordance with an embodiment of the present technology. In the depicted example, small photodiodes 34a including light flickering reduction (LFR) layers are located in the top left area of the large photodiodes 34b. Therefore, in the illustrated embodiment, the small photodiodes (SPDs) are surrounded by the large photodiodes (LPDs) on three sides. Such a relative arrangement of the SPDs including LFR layers with respect to the LPDs may make the SPDs relatively more sensitive to the optical cross-talk, because an individual SPD shares a relatively large boundary with the corresponding LPD. The horizontal arrow in FIG. 10 designates a horizontal direction with an angle Phi of 0°. The diagonal arrow in FIG. 10 designates a diagonal direction with an angle Phi of 450 or 135°.

Figure 11A:
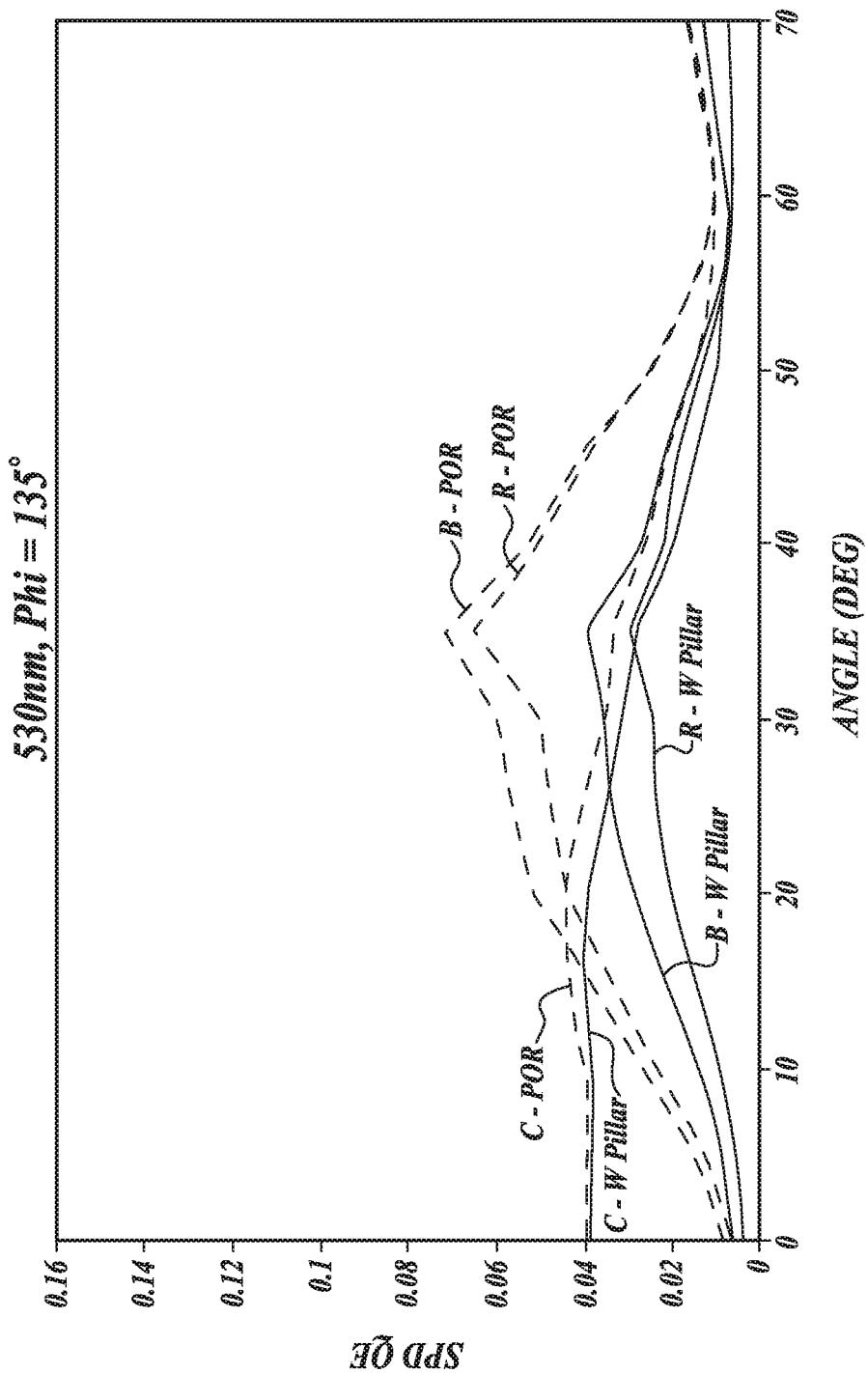
FIGS. 11A and 11B are example graph of quantum efficiency (QE) for the image sensor shown in FIG. 10.
Figure 11B:
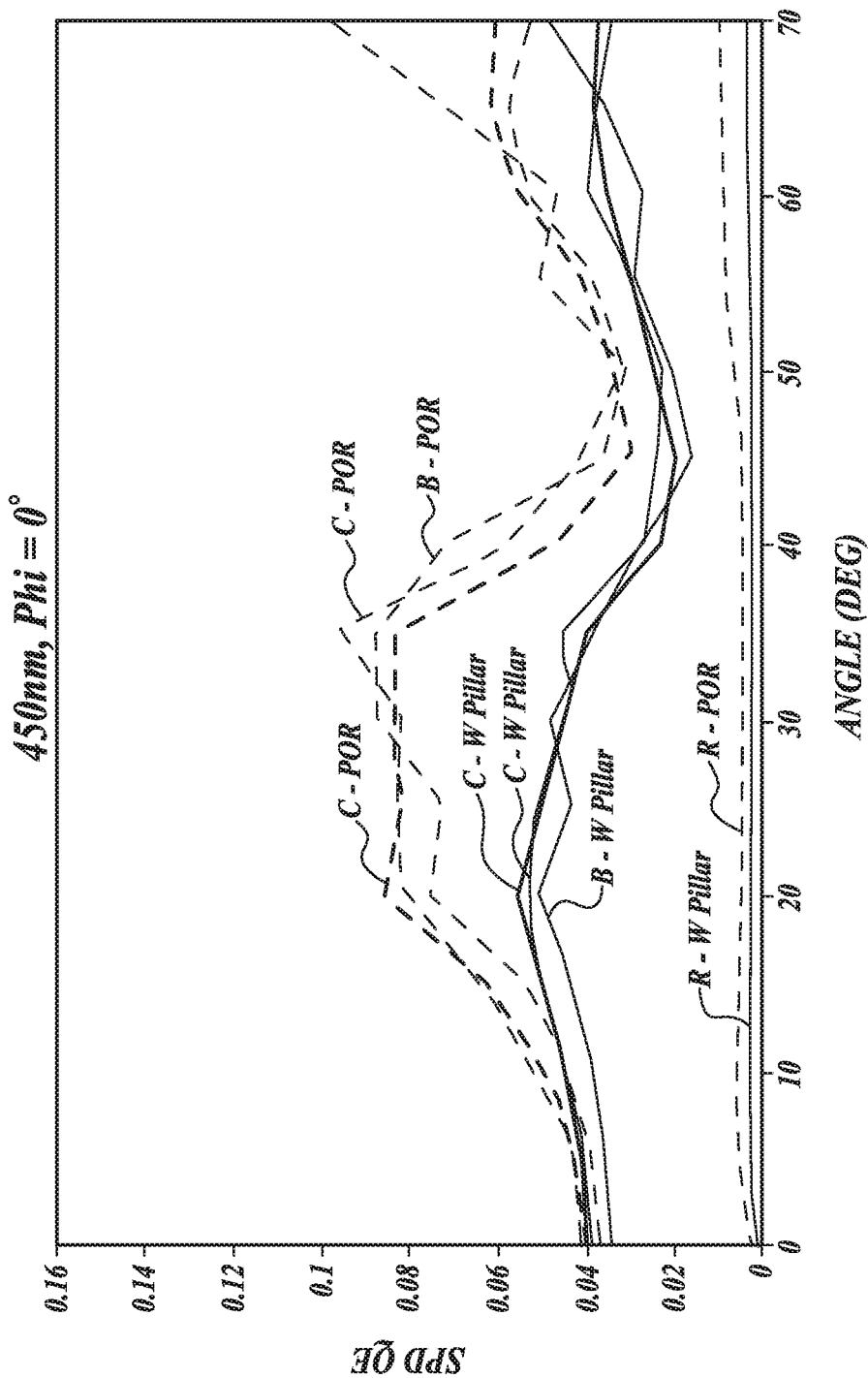

FIGS. 11A and 11B are example graphs of quantum efficiency (QE) for the image sensor shown in FIG. 10. The horizontal axis for each graph shows the incident angle of incoming light in degrees, and the vertical axis shows QE. The color filters are arranged in the red, clear, clear, blue (RCCB) pattern. The dashed lines represent the QE of the small photodiode without pillar structures 81, while the solid lines represent the QE of the small photodiode according to the inventive technology that incorporates the pillar structures 81 (e.g., pillar structures shown in FIG. 4). The labels R-POR, C-POR, C-POR, and B-POR designate the angular response of the small photodiodes without pillar structures 81 for red, clear, clear, and blue small photodiodes respectively. The labels R-W Pillar, C-W Pillar, C-W Pillar, and B-W Pilar designate the QE for red, clear, clear, and blue small photodiodes, respectively, with the small photodiodes with pillar structures 81 in accordance with the inventive technology.

FIG. 11A shows the QE of a small photodiode based on the angle of light coming in diagonally from neighboring large photodiodes (at the angle Phi of 135°). The incoming light was emitted at 530 nm. Without pillar structures 81 (i.e., dashed lines), a portion of light directed toward the large photodiode is absorbed as cross-talk by the small photodiode. This additional light results in a higher QE for the small photodiode and may even saturate the small photodiode. The QE of the photodiode may be reduced when the pillar structures 81 are used. For example, even when the incoming light arrives in at a relatively high CRA angle, the cross-talk may be prevented or at least reduced by the pillar structures 81. As a result, the QE of the small photodiodes is reduced, making them less susceptible to the saturation. Solid lines in the graph represent QE for the photodiodes that include the pillar structure 81 according to the inventive technology. As shown in the illustrated embodiments, the QE values are uniformly lower for each corresponding pair of the photodiodes (e.g., B W-Pilar vs. B-POR, C W-Pilar vs. C-POR, etc.) in accordance with the teachings of the present technology.

FIG. 11B shows another example of the QE of a small photodiode based on the angle of light coming in horizontally from neighboring large photodiodes (at the angle of Phi of 0°). The incoming light was emitted at 450 nm. Without pillar structures 81 (i.e., dashed lines), a portion of light directed toward the large photodiode is received as cross-talk by the small photodiode. The additional light results in a higher QE of the small photodiode and may even saturate the small photodiode. The QE of the small photodiode may be reduced when the pillar structures 81 are introduced. For example, even when the incoming light arrives in at a relatively high CRA angle, the cross-talk may be prevented or at least reduced by the pillar structures 81. As a result, the QE of the small photodiodes is reduced, making them less susceptible to the saturation. Solid lines in the graph represent the QE for photodiodes that include the pillar structure 81 according to the inventive technology. As shown in the illustrated embodiments, the QE values are uniformly lower for each corresponding pair of the photodiodes (e.g., B W-Pillar vs. B-POR, C W-Pillar vs. C-POR, etc.).

Many embodiments of the technology described above may take the form of a computer or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured, or constructed to perform one or more of the computer-executable instructions described above. Of course, any logic or algorithm described herein can be implemented in software or hardware or a combination of software and hardware.

The above description of illustrated examples of the invention, including what is described in the Abstract is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be constructed to limit the invention to the specific examples disclosed in the specification, rather the scope of the invention is to be determined entirely by the following claims, which are to be construed in accordance with established doctrines of claim interpretation.

What is claimed is:

1. An image sensor, comprising:
a plurality of photodiodes arranged in rows and columns of a pixel array disposed in a semiconductor substrate, wherein individual photodiodes of the pixel array are configured to receive incoming light through a backside of the semiconductor substrate, wherein a front side of the semiconductor substrate is opposite from the backside;
a plurality of deep trench isolation (DTI) structures formed laterally with respect to the photodiodes on the backside of the semiconductor substrate, wherein the plurality of DTI structures are arranged between adjacent photodiodes; and
a plurality of pillar structures extending from a metal grid proximate to the backside and aligned with the DTI structures, wherein the pillar structures extend a depth into corresponding DTI structures.

2. The image sensor of claim 1, wherein the DTI structures include a lining of the DTI structures, and wherein the pillar structures are spaced apart from the lining of the corresponding DTI structures.

3. The image sensor of claim 2, wherein the pillar structures include a lining of the pillar structures, and wherein the lining of the pillar structures is spaced apart from the lining of the corresponding DTI structures.

4. The image sensor of claim 1, wherein a relative position of an individual pillar structure with respect to a corresponding individual DTI structure at least in part depends on a location of a particular photodiode within the pixel array.

5. The image sensor of claim 4,
wherein the plurality of DTI structures includes a first DTI structure corresponding to a centrally located pixel within the pixel array and a second DTI structure corresponding to a peripherally located pixel with respect to the pixel array;
wherein the plurality of pillar structures includes a first pillar structure corresponding to the first DTI structure and a second pillar structure corresponding to the second DTI structure; and
wherein a center ($C_P$) of the first pillar structure is more aligned with a center ($C_{DTI}$) of the first DTI structure than a center of the second pillar structure is aligned with a center of the second DTI structure.

6. The image sensor of claim 5, wherein the second DTI structure is located horizontally right or horizontally left with respect to the first DTI structure within the pixel array.

7. The image sensor of claim 5, wherein the second DTI structure is located vertically right or vertically left with respect to the first DTI structure within the pixel array.

8. The image sensor of claim 5,
wherein the plurality of DTI structures further includes a third DTI structure;
wherein the plurality of pillar structures further includes a third pillar structure corresponding to the third DTI structure;
wherein the center ($C_P$) of the first pillar structure is aligned with the center ($C_{DTI}$) of the first DTI structure more than a center of the third pillar structure is aligned with a center of the third DTI structure; and
wherein a lining of the third pillar structure contacts a lining of the third DTI structure.

9. The image sensor of claim 1, wherein the plurality of photodiodes comprises a first photodiode having a first full well capacity and a second photodiode having a second full well capacity that is larger than the first full well capacity of first photodiode.

10. The image sensor of claim 9, and wherein the DTI structures at least partially separate the first photodiode from the second photodiode.

11. The image sensor of claim 10, further comprising a first color filter optically coupled with the first photodiode and a second color filter optically coupled with the second photodiode, wherein the first color filter and the second color filter are at least partially embedded into the metal grid.

12. The image sensor of claim 11, further comprising a first microlens optically coupled with the first photodiode and a second microlens optically coupled with the second photodiode, wherein the first microlens and the second microlens are proximate to the backside of the substrate.

13. A method for manufacturing an image sensor, comprising:
providing a semiconductor substrate, wherein the semiconductor substrate has a backside and a front side opposite from the backside;
forming photodiodes arranged in rows and columns of a pixel array in the semiconductor substrate, wherein individual photodiodes are configured to receive incoming light through the backside of the semiconductor substrate;
forming deep trench isolation (DTI) structures laterally with respect to the photodiodes and proximate to the backside of the semiconductor substrate, wherein the DTI structures are arranged between adjacent photodiodes;
forming a layer of buffer oxide proximate to the DTI structures, the layer of buffer oxide having a first side facing the DTI structure, and a second side facing away from the first side;
etching the layer of buffer oxide to form a plurality of openings that are at least partially aligned with the DTI structures;
forming a metal layer having a first surface facing the second side of the layer of buffer oxide, and a second surface facing away from the first surface;
etching the metal layer, wherein the etched metal layer forms a metal grid proximate to the backside, with pillar structures extending from the metal grid towards corresponding DTI structures, and wherein the pillar structures extend a depth into corresponding DTI structures; and
forming a plurality of color filters, wherein the color filters are at least partially embedded into the metal grid.

14. The method of claim 13, further comprising:
forming a plurality of microlenses proximate to the corresponding plurality of color filters.

15. The method of claim 13, further comprising forming a lining of the DTI structures, wherein the pillar structures are spaced apart from the lining of the corresponding DTI structures.

16. The method of claim 15, further comprising forming a lining of the pillar structures, wherein the lining of at least some of the pillar structures is spaced apart from the lining of the corresponding DTI structures.

17. The method of claim 13, wherein a relative position of an individual pillar structure with respect to a corresponding individual DTI structure at least in part depends on a location of a particular photodiode within a pixel array of the image sensor.

18. The method of claim 17,
   wherein forming DTI structures includes forming a first DTI structure that is centrally located within the pixel array of the image sensor and a second DTI structure that is peripherally located with respect to the pixel array of the image sensor;
   wherein forming the pillar structures include forming a first pillar structure corresponding to the first DTI structure and forming a second pillar structure corresponding to the second DTI structure; and
   wherein a center ($C_P$) of the first pillar structure is more aligned with a center ($C_{DTI}$) of the first DTI structure than a center of the second pillar structure is aligned with a center of the second DTI structure.

\* \* \* \* \*